US006710474B2

(12) United States Patent
Franck

(10) Patent No.: US 6,710,474 B2
(45) Date of Patent: Mar. 23, 2004

(54) CIRCUIT ARRANGEMENT FOR SWITCHING ON A PARTIAL CIRCUIT ARRANGEMENT

(75) Inventor: Felix Franck, Munich (DE)

(73) Assignee: Patent-Treuhand-Gesellschaft fur elektrische Gluhlampen mbH, Munich (DE)

( * ) Notice: Subject to any disclaimer, the term of this patent is extended or adjusted under 35 U.S.C. 154(b) by 234 days.

(21) Appl. No.: 10/032,566

(22) Filed: Jan. 2, 2002

(65) Prior Publication Data

US 2002/0114121 A1 Aug. 22, 2002

(30) Foreign Application Priority Data

Jan. 12, 2001 (DE) ........................................ 101 01 291

(51) Int. Cl.$^7$ ................................................ H03K 17/04

(52) U.S. Cl. .................. 307/125; 307/131; 315/209 R; 363/132

(58) Field of Search ................................ 307/125, 131; 315/307, 219, 224, 209 R; 363/97, 98, 37, 38, 132; 327/419

(56) References Cited

U.S. PATENT DOCUMENTS 5,783,911 A * 7/1998 Rudolph ..................... 315/225
5,825,136 A * 10/1998 Rudolph ..................... 315/291
5,828,244 A * 10/1998 Palara et al. ................ 327/108
5,864,211 A * 1/1999 Kiermeier ................... 315/127
5,883,472 A * 3/1999 Raiser ........................ 315/225
5,925,985 A * 7/1999 Zeng et al. ................. 315/224
5,962,987 A * 10/1999 Statnic ....................... 315/248
6,044,000 A * 3/2000 Twardzik ..................... 363/90
6,057,611 A * 5/2000 Reiser ........................ 307/125
6,078,144 A * 6/2000 Twardzik ................ 315/209 R
6,104,142 A * 8/2000 Zuchtriegel ............. 315/209 R
6,144,568 A * 11/2000 Franck et al. ................. 363/39
6,163,114 A * 12/2000 Fischer et al. .............. 315/291
6,172,890 B1 * 1/2001 Franck ......................... 363/98
6,181,080 B1 * 1/2001 Schleicher .................. 315/248
6,198,231 B1 * 3/2001 Schemmel et al. ......... 315/225
6,246,173 B1 * 6/2001 Fischer et al. ......... 331/117 FE
6,266,259 B1 * 7/2001 Franck ....................... 363/132
6,268,758 B1 * 7/2001 Limmer et al. ............. 327/424
6,411,040 B1 * 6/2002 Ertl et al. ...................... 315/82
6,483,256 B2 * 11/2002 Heckmann .................. 315/276
6,531,834 B2 * 3/2003 Haeusser-Boehm et al. ..... 315/291
6,566,822 B2 * 5/2003 Schadhauser et al. ....... 315/224
6,603,674 B2 * 8/2003 Franck et al. ................. 363/97

* cited by examiner

*Primary Examiner*—Gregory J. Toatley, Jr.
*Assistant Examiner*—Roberto J. Rios

(57) ABSTRACT

A circuit for switching on a partial circuit includes a first switching element (T1), a second switching element (T2 to T6), an activation circuit for the first switching element, a first diode (D1), a second diode (D2), and a third diode (D3). During operation, when the partial circuit is being switched on, first switching element (T1) is activated and second switching element (T2 to T6) is assigned no activity. The activation circuit for the first switching element (T1) includes a storage capacitor (C1) and a DIAC coupled to a control electrode of the first switching element (T1). First diode (D1), second diode (D2), and third diode (D3) are arranged such that stored energy in storage capacitor (C1) is more effectively utilized for activating the first switching element (T1), thus allowing use of a smaller capacitance for the storage capacitor (C1).

9 Claims, 9 Drawing Sheets

CIRCUIT ARRANGEMENT FOR SWITCHING ON A PARTIAL CIRCUIT ARRANGEMENT

TECHNICAL FIELD

The present invention relates to a circuit arrangement for switching on a partial circuit arrangement, the circuit arrangement having a first switching element with a control electrode and a reference electrode, the reference electrode being connected to a reference potential. It further comprises a partial circuit arrangement, the first switching element having to be activated when the circuit arrangement is being switched on, and at least one second switching element, which is required for the operation of the circuit arrangement after the partial circuit arrangement has been switched on but which is not assigned any activity when the partial circuit arrangement is being switched on, the at least one second switching element having a control electrode and a reference electrode, which is connected to the reference potential. It further comprises an activation circuit for the first switching element, the activation circuit comprising a storage capacitor which, to activate the first switching element, is connected via a DIAC to the control electrode of the first switching element, and a first diode which is arranged between the reference potential and the storage capacitor in such a way that it is made possible for a current to flow to activate the first switching element.

PRIOR ART

In order to clarify the problem on which the invention is based, such a circuit arrangement, disclosed by the prior art, is illustrated in FIG. 1. It is used by the applicant of the present invention as a starting circuit for lamp operating devices which have a half-bridge arrangement. In particular as a starting circuit for a freely oscillating converter, one of the two half-bridge transistors initially has to be switched on. In the case of a freely oscillating converter, which is to be assumed here by way of example in order to illustrate the invention, the two half-bridge transistors are driven via their control electrode, in actual operation, only after a separate starting operation. In FIG. 1, the transistor T1 represents one of the two half-bridge transistors. The transistor T2 is a second switching element, which is required for the operation of the circuit arrangement after it has been switched on, but which is assigned no activity while the partial circuit arrangement is being switched on, here the lower half of the freely oscillating converter for operating the lamp. The bases of the transistors T1 and T2 are connected to each other via a resistor R1. In order to switch on the transistor T1, that is to say to start an oscillation, a pulse-like switching-on signal is necessary. In the present case, this is achieved by a capacitor C1, which on one side is connected via at least one resistor R to the positive signal +(NGR) from a mains rectifier and on the other side is connected via a resistor R2 to ground, being charged up. This capacitor voltage is present on one side of a DIAC, whose other terminal is connected to the control electrode of transistor T1. Then, as soon as the voltage on that terminal of the DIAC which is connected to the capacitor C1 exceeds a certain limiting value, said DIAC breaks down and permits a sudden current surge to the control electrode of the transistor T1. By this means, the transistor T1 is switched on, and therefore the freely oscillating converter is started. The firing current for starting the freely oscillating converter initially flows in the circuit comprising DIAC, transistor T1, reference potential, resistor R2 and capacitor C1. However, as the firing current grows, the voltage drop across the resistor R2 at some time becomes so high that the firing current experiences a lower resistance if it flows via the diode D1. The current flow then changes from the resistor R2 to the diode D1.

The task of the transistor T2 begins after the firing of the transistor T1. In the present example, it consists in blocking the DIAC during normal operation, since repeated firing of the DIAC would disrupt the continuous operation of the freely oscillating converter. The latter functions in such a way that the base signal of transistor T1 is also applied via R1 to the base terminal of the transistor T2. The collector of transistor T2 is connected to the potential between storage capacitor C1 and DIAC. During normal operation, the transistor T1 is driven via the line BT1. This signal is also applied to the base of the transistor T2 via R1.

The storage capacitor C1 is therefore discharged regularly via T2, and no disruption to the operation of transistor T1 occurs.

The disadvantage of this known circuit arrangement is that precisely at the time at which the full energy stored in the storage capacitor C1 leads to the breakdown of the DIAC, some of the energy is led past the envisaged location—namely the control electrode of the transistor T1—via R1 to the base of transistor T2. This leads to the transistor T2 turning on and, via its operating electrode, dissipating some of the energy stored in the storage capacitor C1 to the reference potential. As a consequence, it can be established that not all of the energy stored in C1 is available for firing the transistor T1, but is dissipated via a switching element which is not assigned any activity during the actual firing operation. As explained above, the purpose of transistor T2 is based on normal operation, that is to say after the firing of transistor T1.

The negative result of this is that the storage capacitor C1 has to be dimensioned to be considerably larger, which in turn results in the entire circuit arrangement being slowed down.

SUMMARY OF THE INVENTION

The object of the present invention is therefore to develop a generic circuit arrangement in such a way that the disadvantages of the prior art are overcome, in particular the provision of a faster circuit arrangement is made possible.

According to the invention, this object is achieved in that, in series with the first diode, on the side of the first diode facing away from the reference potential, a second diode is arranged in the same orientation as the first diode, the junction between the first and the second diode being connected to the control electrode of the at least one second switching element and, in series in a connection between the control electrode of the second switching element and the reference potential, in addition to the second diode, at least one third diode is connected in the same orientation as the second diode.

The invention is based on the fundamental idea of switching off at least one second switching element actively via the DIAC at the same time as the first switching element is initially switched on, the switching-off action also being effected by the DIAC. In particular, in order to switch off the at least one second switching element, use is made of the current which flows through the storage capacitor C1 belonging to the DIAC when the latter is fired. Therefore, the at least one second switching element is switched off by exactly the same current by which the first switching element T1 is switched on. This implementation is optimal with regard to the cost question, since no further controllers, timing elements etc. are needed. It is in particular independent of component parameters and can therefore preferably also be used in mass production. Moreover, it is naturally real-time capable. With minimum expenditure, the invention provides an extremely robust and exactly functioning solution.

A preferred embodiment of the invention is distinguished by the fact that the side of the series circuit comprising the second and third diode and facing away from the control electrode of the second switching element-is connected firstly to the storage capacitor and secondly via a resistor to the reference potential. This measure means that the firing operation is boosted since, when the voltage drop across the resistor becomes greater than the sum of the diode forward voltages, the diodes take over the firing current.

A further preferred embodiment is distinguished by the fact that the junction between the second and third diode is connected to the storage capacitor, and the third diode is connected by its other terminal to the reference potential. In the case of this variant, the charging current for the storage capacitor flows through the third diode, and the discharge current flows via a path which comprises D1 and D2. As compared with the exemplary embodiment previously described, this results in the advantage that, lacking a resistor, the residual current through the resistor is also dispensed with. The energy present in the storage capacitor C1 is therefore used more effectively for the firing operation.

A circuit arrangement according to the invention can also comprise a plurality of second switching elements, in particular a number $\geqq 2$, the reference electrodes of all the second switching elements being connected to the same reference potential, each second switching element being assigned a second diode, and the sides of the respective second diodes facing away from the control electrode of the respective second switching element being interconnected, so that the third diode acts for all the second switching elements. The advantage of this embodiment is that a single third diode acts for a large number, in particular for all, of the second switching elements.

A further cost reduction is permitted by an embodiment which has m first diodes, where $1 \leqq m \leqq n$, the association in each case between a first diode and the n second switching elements being as desired. By means of this measure, the reduction to a single first diode is made possible in the case of a plurality of second switching elements.

At least one second switching element can have an operating electrode which is coupled to the line between the storage capacitor and the control electrode of the first switching element. The measures according to the invention are desirable in particular in the case of such wiring of a second switching element, since in the case of a connection of this type of a second switching element, there is a particularly high risk that the energy envisaged for the activation of the first switching element will flow away unused via the second switching element. The same is true of the case in which at least one second switching element is coupled by its control electrode to the line between the storage capacitor and the control electrode of the first switching element.

In order to charge the storage capacitor, it can be arranged in series with at least one resistor between a voltage source and the reference potential.

According to a further aspect of the present invention, an operating device for a lamp is also provided which has a circuit arrangement according to the invention, the circuit arrangement comprising a half-bridge arrangement with two half-bridge transistors, and the first switching element being one of the two half-bridge transistors.

Further advantageous embodiments emerge from the subclaims.

DESCRIPTION OF THE DRAWINGS

In the following text, exemplary embodiments will be described in more detail with reference to the appended drawings, in which:

FIG. 9*a* shows the variation over time of various characteristic variables for the circuit arrangement of FIG. 8*a.

In the following description of the figures, the same reference symbols are used throughout for the same and identically acting elements in the various exemplary embodiments.

FIG. 2 shows a first embodiment of a circuit arrangement according to the invention which, as compared with the circuit arrangement illustrated in FIG. 1 and disclosed by the prior art, is distinguished by the fact that two further diodes D2, D3 are arranged in series with the diode D1, the anode of the diode D2 being connected to the base of the transistor T2. The collector of the transistor T1 is connected to an associated collector terminal $C_{T1}$, and the base is connected to an associated base drive $B_{T1}$. The operating electrode $C_{T2}$ of the transistor T2 is connected to the left-hand terminal of the DIAC, and the base drive $B_{T2}$ is connected to the resistor R1. Since the present circuit arrangement can be used not only for the transistors of an operating device for a lamp, the positive terminal of the storage capacitor C1, which in FIG. 1 in accordance with the known prior art was still coupled to the positive terminal of the mains rectifier, will now be referred to in general as the positive terminal. This is because the present circuit can be used in many areas, for example in switching transistors of a cell converter.

With regard to the function: as soon as the DIAC fires, the potential P1 of the junction between the storage capacitor C1 and the resistor R2 jumps below the emitter potential of the transistor T2 in accordance with $R2 \cdot I_{DIAC}$, as a result of the firing current initially flowing through R2. Because of the growing current $I_{DIAC}$, the potential P1 drops again until finally the magnitude of the forward voltages of the diodes D2 and D3 is reached. The diodes D2 and D3 therefore conduct, as a result of which the potential on the basis of the transistor T2 falls and therefore the transistor T2 is switched off. Further growth of the current $I_{DIAC}$ leads to the voltage drop across the resistor R2 becoming greater than the sum of the forward voltages of the diodes D1 to D3. This leads to the firing current $I_{DIAC}$ then flowing via the three diodes, which means that the firing operation comes into the hard phase. At this time, the transistor T2 is reliably switched off with a base-emitter voltage of $-U_{D1}$ (corresponding approximately to −0.7 V).

The series circuit comprising the diodes D2 and D3 is necessary to prevent the current transferred via the resistor R1 to the base of transistor T2 flowing away via the resistor R2. An individual diode would not be sufficient, since the base-emitter path of the transistor T2 likewise corresponds to a diode path.

Conversely, the diodes D2 and D3 reliably prevent the transistor T2 being switched on by the potential P1.

Figure 1:
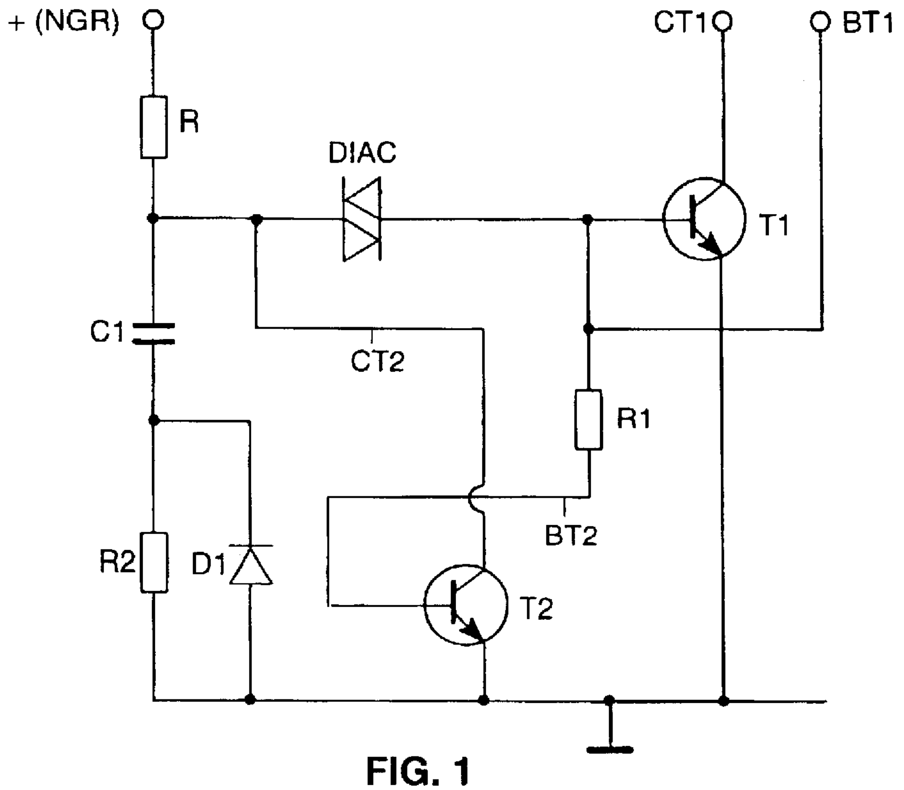
FIG. 1 (Prior Art)
FIG. 1 shows a circuit arrangement disclosed by the prior art for switching on a partial circuit arrangement.
Figure 2:
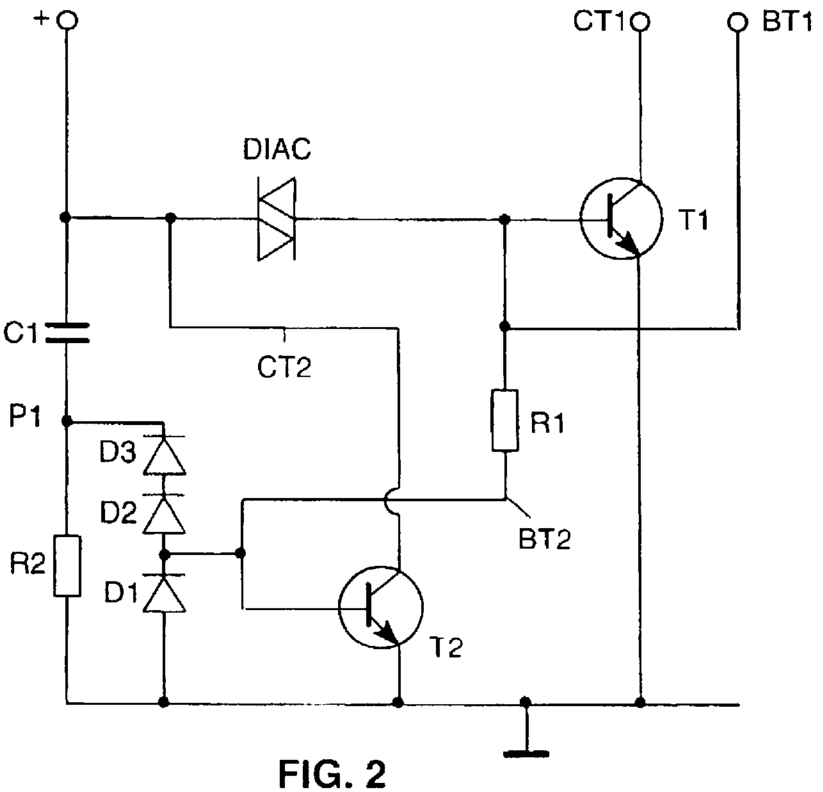
FIG. 2 shows a first embodiment of a circuit arrangement according to the invention.
Figure 3:
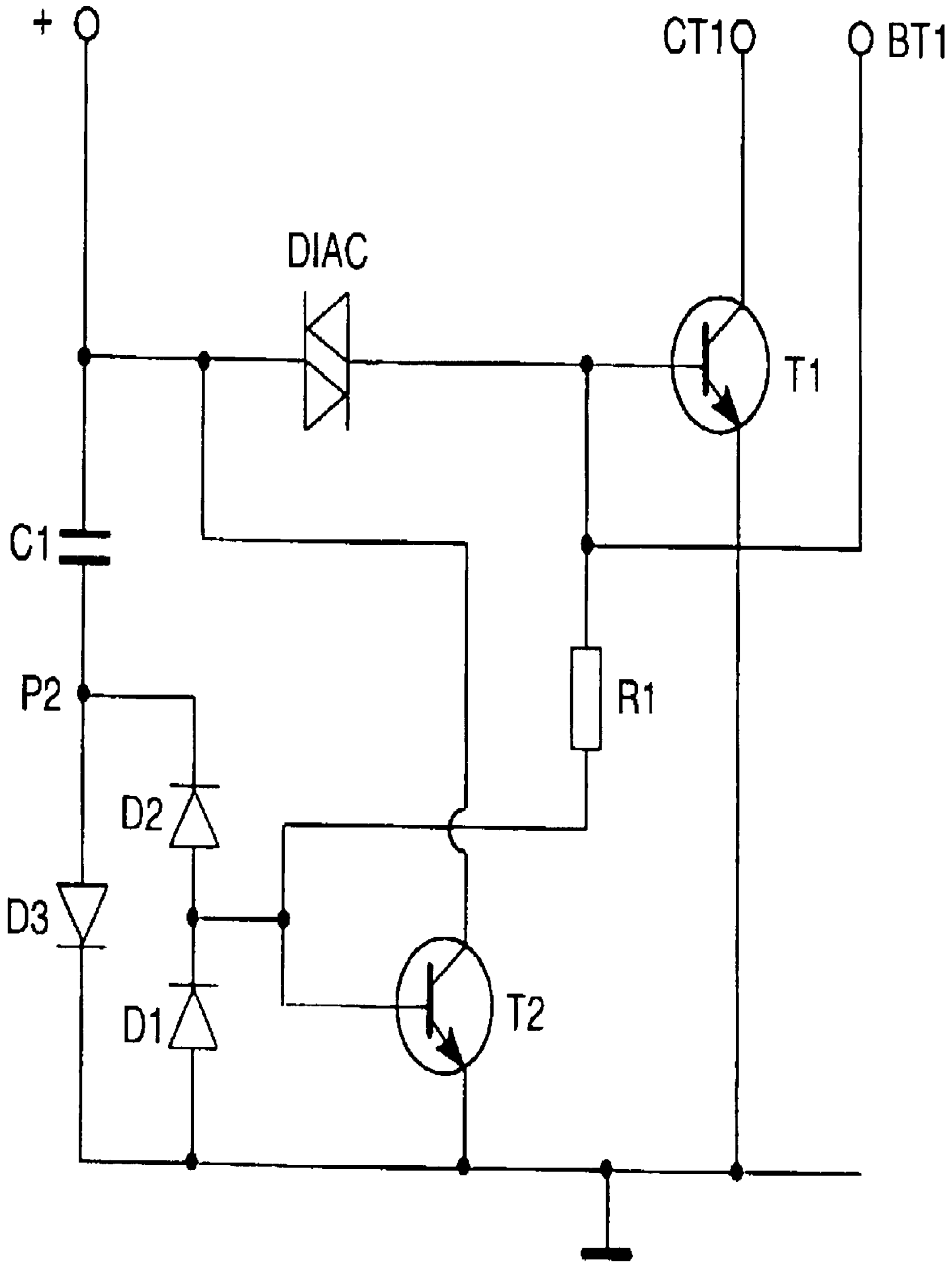
FIG. 3 shows a second embodiment of a circuit arrangement according to the invention.

The embodiment illustrated in FIG. 3 differs from that shown in FIG. 2 in that the third diode D3 has assumed the place of the resistor R2, and that the storage capacitor C1 is connected to the junction P2 between the diode D2 and the diode D3. The charging current of the storage capacitor C1 therefore flows through the diode D3, and the discharge current $I_{DIAC}$ flows via the series circuit comprising the diode D1 and the diode D2.

Figure 4:
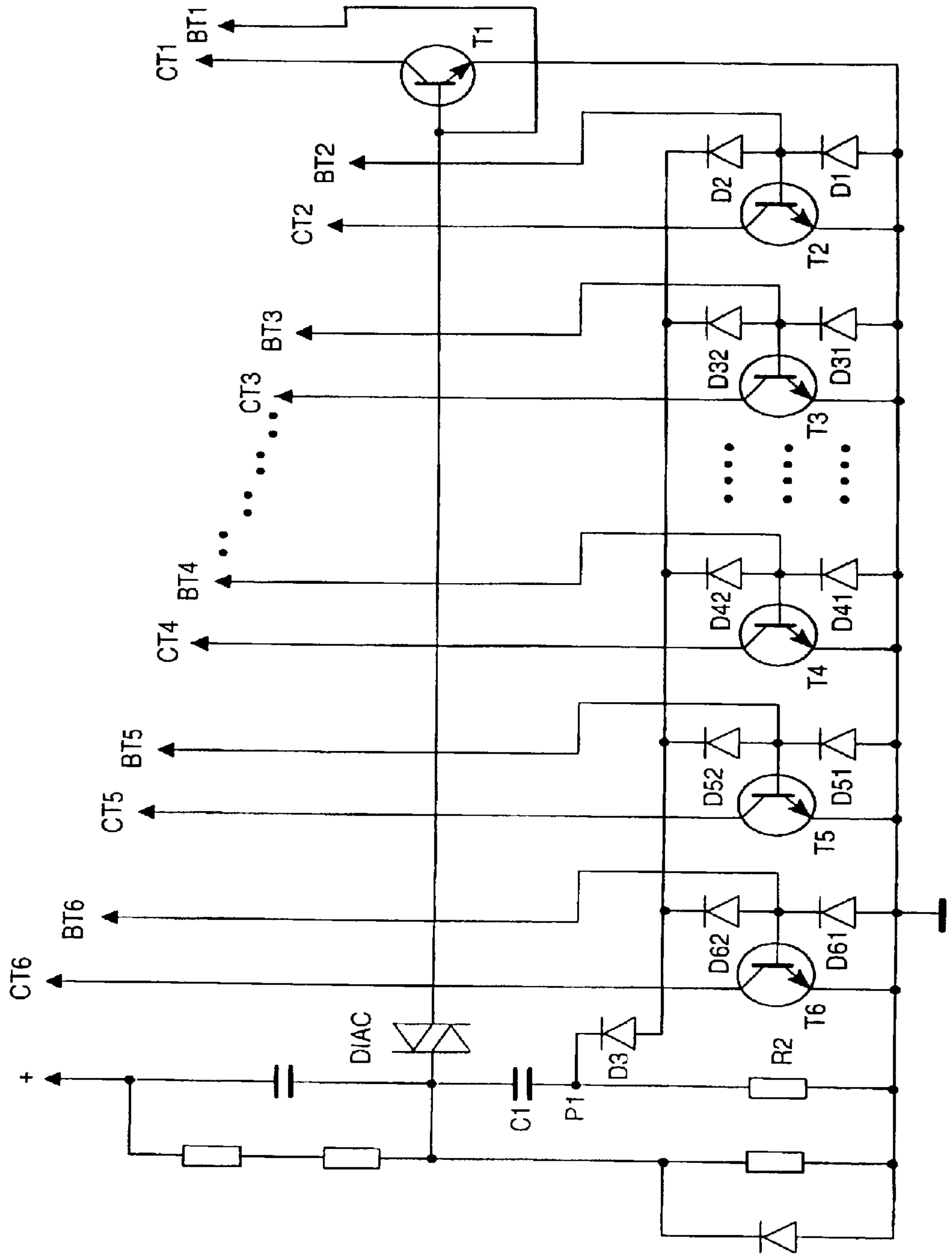
FIG. 4 shows a third embodiment of a circuit arrangement according to the invention.

In the embodiment illustrated in FIG. 4, it is shown that the idea according to the invention can also be applied to a plurality of transistors, here T2 to T6. Each transistor T1 to T6 has a base drive $B_{T1}$ to $B_{T6}$ and a collector connection $C_{T1}$ to $C_{T6}$. In addition, each of the transistors T2 to T6 is assigned a first and a second diode D31 to D62. The emitters of all the transistors are interconnected. All the transistor groups, that is to say the transistors and their associated first and second diode, are connected via a third diode D3 to the junction P1 between the resistor R2 and storage capacitor C1. FIG. 4 already shows an optimization to the extent that all the transistor groups are assigned only a single third diode D3. Instead of the embodiment illustrated here, each transistor group could be connected via its own third diode to the junction P1 between resistor R2 and storage capacitor C1. The optimized arrangement illustrated in FIG. 4 reliably blocks any base current flowing away for one of the transistors T2 to T6 via the resistor R2, avoids mutual influence between the base drives of T2 to T6 and prevents any of the transistors T2 to T6 being switched on undesirably by the potential at the point P1.

Figure 5:
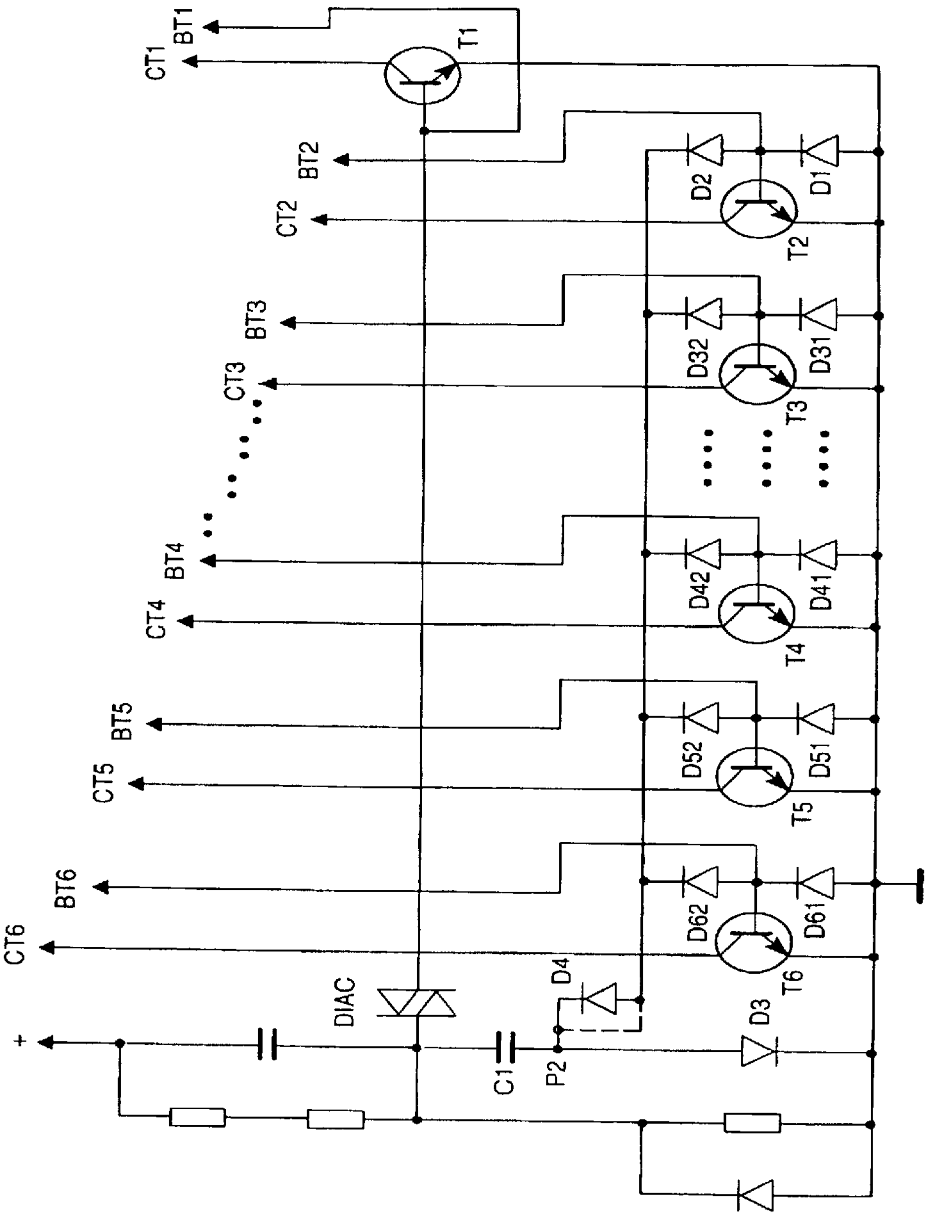
FIG. 5 shows a fourth embodiment of a circuit arrangement according to the invention.

In the embodiment illustrated in FIG. 5, as compared with the embodiment of FIG. 4, the resistor R2 has been replaced by the diode D3. The third diode taken over from FIG. 4, designated by D4 in FIG. 5, can be replaced by a short circuit in this case, as indicated dashed.

Figure 6:
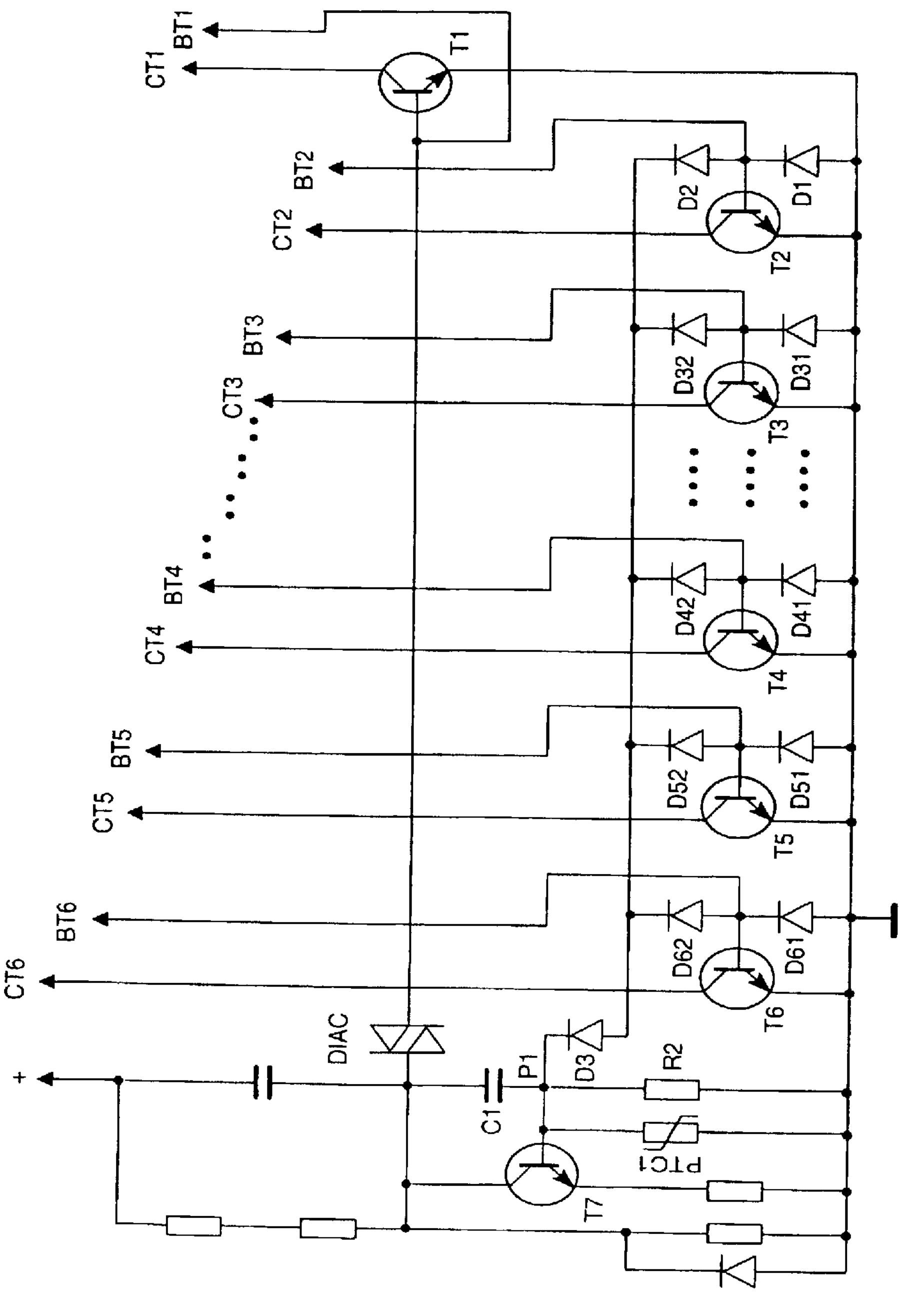
FIG. 6 shows a fifth embodiment of a circuit arrangement according to the invention.

In the embodiment illustrated in FIG. 6, a resistor $P_{TC1}$ with a positive temperature coefficient is connected in parallel with the resistor R2. The junction P1 between resistor R2 and storage capacitor C1 is connected to the base of a transistor T7.

Figure 7A:
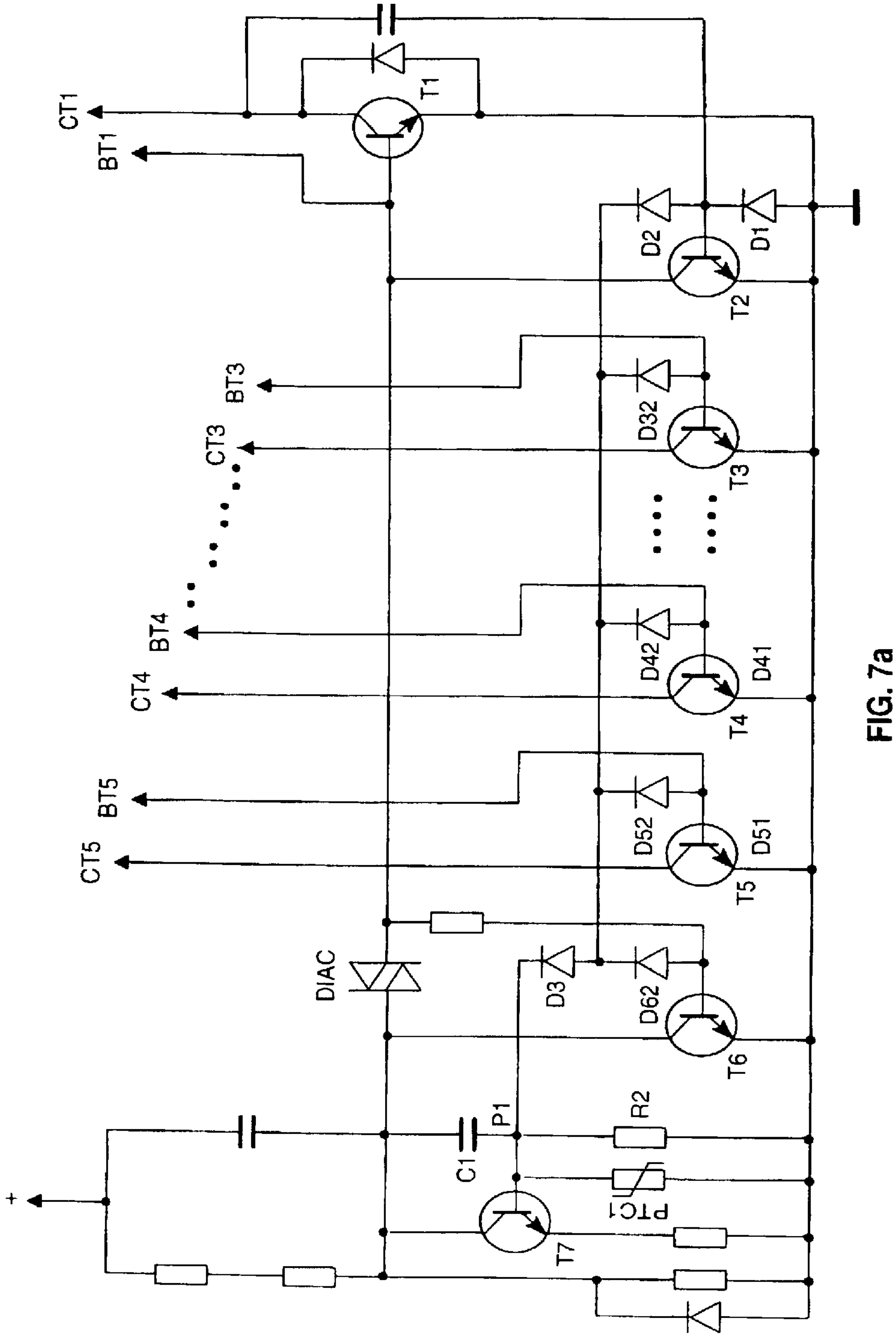
FIG. 7*a* shows a sixth embodiment of a circuit arrangement according to the invention.

The embodiment illustrated in FIG. 7*a* is optimized with respect to the embodiment of FIG. 6 to the effect that the entire circuit arrangement now has a single first diode D1, since it is generally sufficient if the discharge current $I_{DIAC}$ is carried by a single first diode. With regard to the embodiment of FIG. 4, it would therefore be possible for the diodes D31 to D61 to be dispensed with there. For the case in which R2 has a sufficiently low resistance, for example less than 100 Ω, all the first diodes could also be left out, provided the voltage at the junction between the storage capacitor C1 and the resistor R2 does not fall below the permissible base-emitter reverse voltage for the transistors T2 to T6.

Figure 7B:
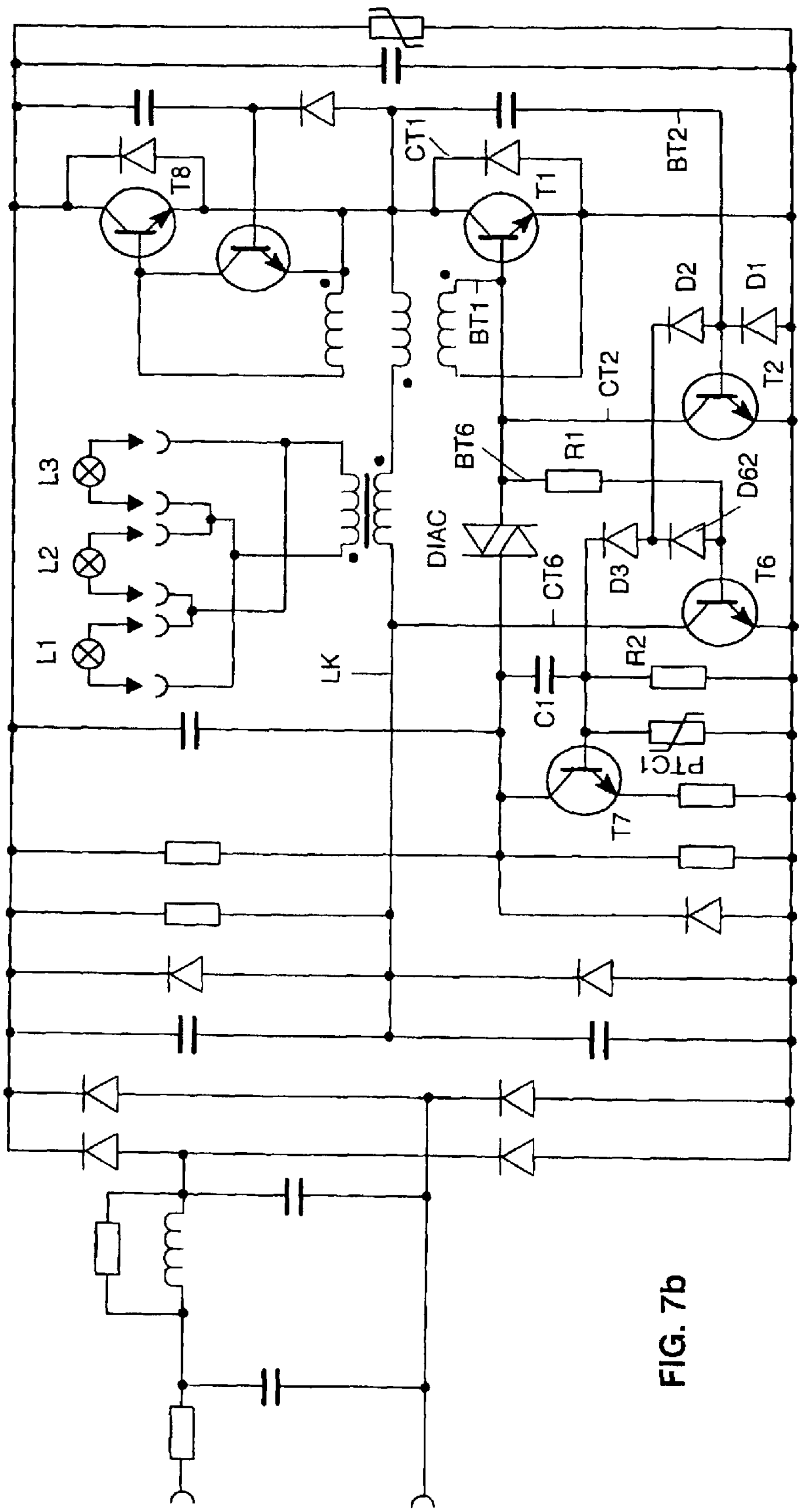
FIG. 7*b* shows an operating device for a lamp having a circuit arrangement according to the invention in accordance with FIG. 7*a;*

A circuit arrangement according to the invention in an operating device for a lamp is illustrated in FIG. 7*b*. In this case, a half-bridge arrangement comprises the transistors T1 and T8. The transistor T1 is initially switched on via the DIAC. In this circuit, a freely oscillating converter is implemented, that is to say the output signal of at least one half-bridge transistor is led back to the bases of the two half-bridge transistors T1 and T8. The signal flowing in the line LK is transmitted to lamps L1, L2, L3. The remaining switching elements used in the operating device are of subordinate importance with regard to the present invention, for which reason they will not be explained specifically.

Figure 8A:
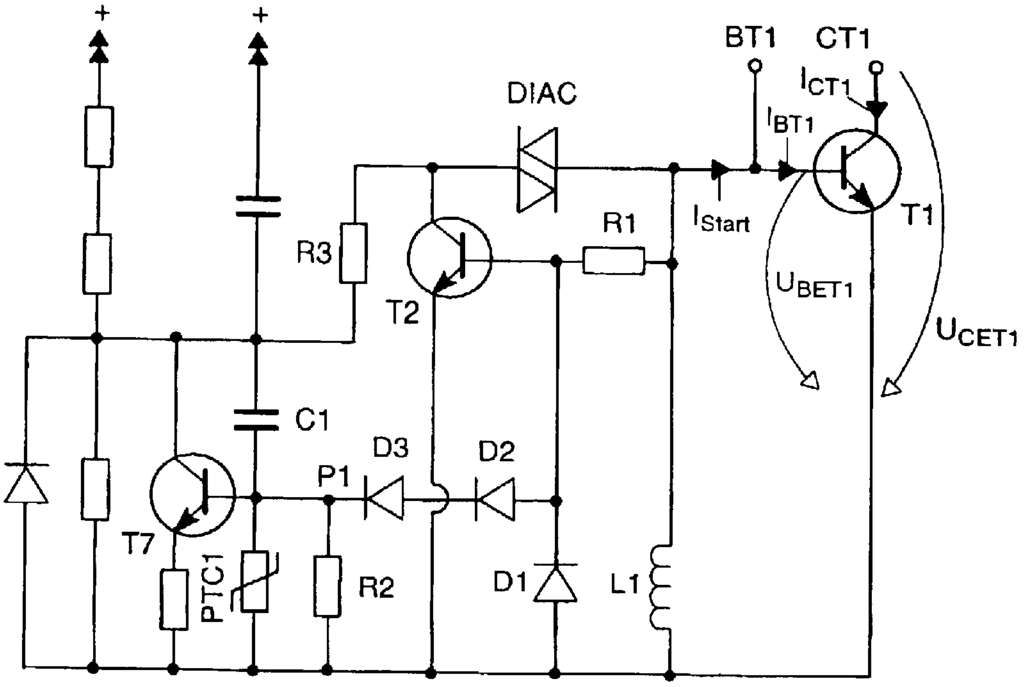
FIG. 8*a* shows a seventh embodiment of a circuit arrangement according to the invention.
Figure 9A:
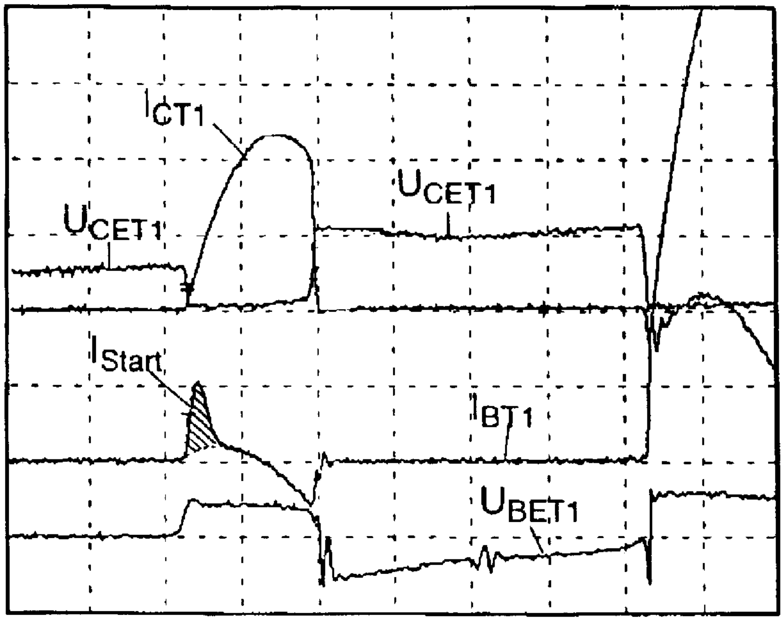

The embodiment illustrated in FIG. 8*a* resembles that illustrated in FIG. 7*a* in principle, there being only one switching element T2. A resistor R3 is connected in between the connecting path between storage capacitor C1 and DIAC. Correlated with this embodiment is the variation of various signals over time illustrated in FIG. 9*a*. In the upper half of the illustration, the variation of the collector current $I_{CT1}$ of the transistor T1 and its collector-emitter voltage $U_{CET1}$ are shown. In the lower half, the variation of the base-emitter voltage $U_{BET1}$ of transistor TI is shown, and also the current $I_{BT1}$ actually arriving at the base of transistor T1.

Figure 8B:
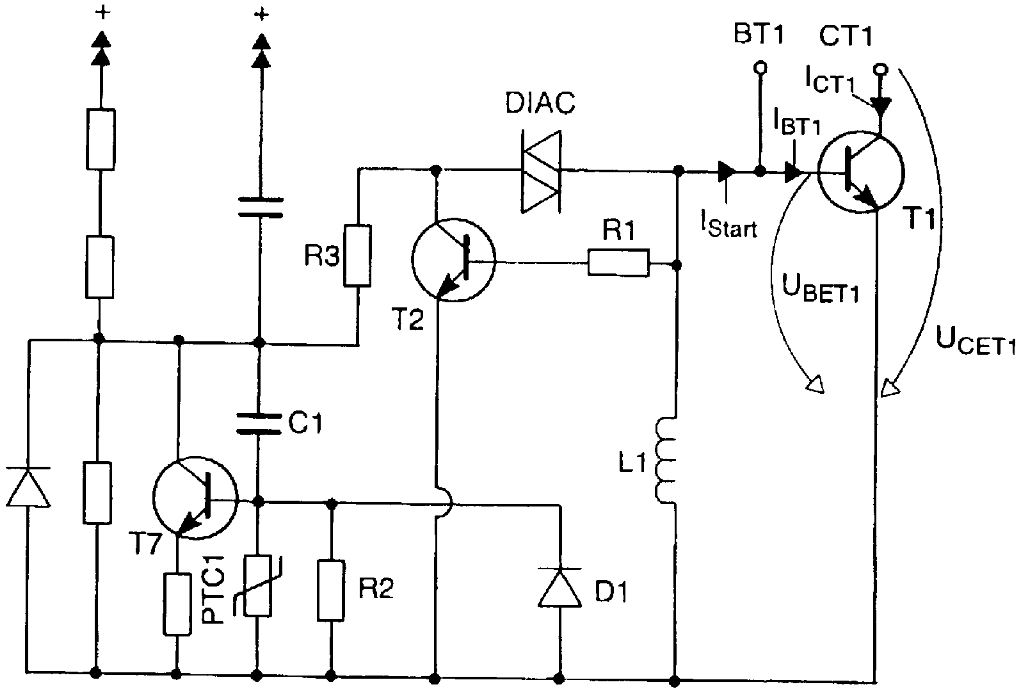
FIG. 8b (Prior Art)
FIG. 8*b* shows a circuit arrangement which corresponds to the circuit arrangement from FIG. 8*a* but without the inventive measures.
Figure 9B:
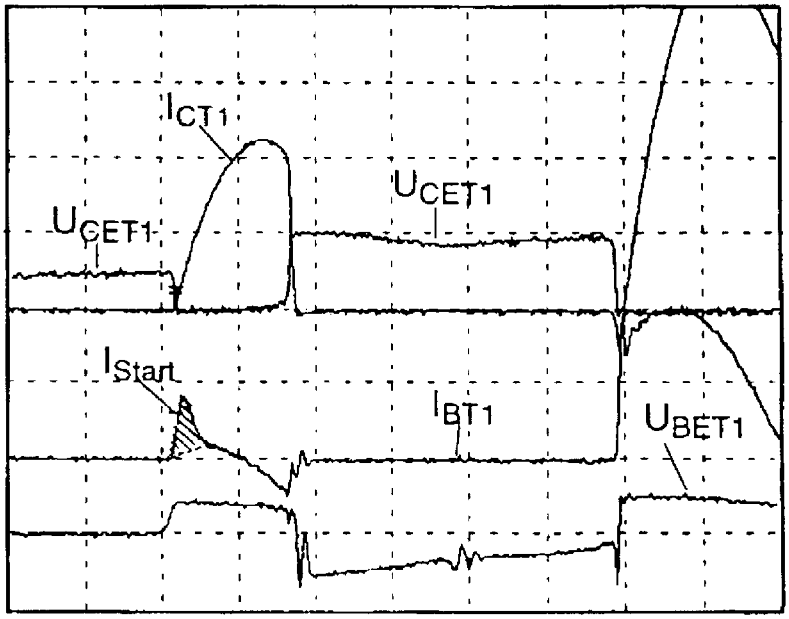
* and FIG. 9*b* shows the variation over time of various characteristic variables for the circuit arrangement of FIG. 8*b*.

By contrast, FIG. 8*b* shows the circuit arrangement of FIG. 8*a* without the measures according to the invention, that is to say the diodes D2 and D3 are missing, the base of transistor T2 is connected via R1 to the terminal of the DIAC on the side of T1. Correlated with this arrangement is the variation of various variables over time illustrated in FIG. 9*b*. The upper half again shows the collector current $I_{CT1}$ of transistor T1 and the collector-emitter voltage $U_{CET1}$ of transistor T1. The lower half again shows the base-emitter voltage $U_{BET1}$ and the current $I_{BT1}$ arriving at the base of transistor T1. As a comparison between FIG. 9*a* and FIG. 9*b* makes clear, the pulse-like current $I_{start}$ at the base of transistor T1 has risen considerably on account of the measure according to the invention: while the corresponding current variation in FIG. 9*b* only reaches 140 mA as peak value, in the illustration of FIG. 9*a*, this clearly exceeds the 180 mA value.

What is claimed is:

1. A circuit arrangement for switching on a partial circuit arrangement, having a first switching element (T1), the first switching element (T1) having a control electrode and a reference electrode, which is connected to a reference potential;

a partial circuit arrangement, the first switching element (T1) having to be activated when the partial circuit arrangement is being switched on;

at least one second switching element (T2 to T6), which is required for the operation of the circuit arrangement after the partial circuit arrangement has been switched on, but which is not assigned any activity when the partial circuit arrangement is being switched on, the at least one second switching element (T2 to T6) having a control electrode and a reference electrode, which is connected to the reference potential;

an activation circuit for the first switching element (T1), the activation circuit comprising a storage capacitor (C1) which, to activate the first switching element (T1), is connected via a DIAC to the control electrode of the first switching element (T1); and a first diode (D1) which is arranged between the reference potential and the storage capacitor (C1) in such a way that it is made possible for a current to flow to activate the first switching element (T1);

characterized in that in series with the first diode (D1), on the side of the first diode (D1) facing away from the reference potential, a second diode (D2) is arranged in the same orientation as the first diode (D1), the junction between the first and the second diode (D1, D2) being connected to the control electrode of the at least one second switching element (T2 to T6), and in series in a connection between the control electrode of the second switching element (T2 to T6) and the reference potential, in addition to the second diode (D2), at least one third diode (D3) is connected in the same orientation as the second diode (D2).

2. The circuit arrangement as claimed in claim 1, characterized in that the side of the series circuit comprising the second and third diode (D2, D3) facing away from the control electrode of the second switching element (T2 to T6) is connected firstly to the storage capacitor (C1) and secondly via a resistor (R2) to the reference potential.

3. The circuit arrangement as claimed in claim 1, characterized in that the junction (P1) between the second and third diode (D2, D3) is connected to the storage capacitor (C1), and the third diode (D3) is connected by its other terminal to the reference potential.

4. The circuit arrangement as claimed in claim 1, characterized in that it comprises at least n, n≧2, second switching elements (T2 to T6), the reference electrodes of all the second switching elements (T2 to T6) being connected to the same reference potential, each second switching element (T2 to T6) being assigned a second diode (D2 to D62), and the sides of the respective second diodes (D2 to D62) facing away from the control electrode of the respective second switching element (T2 to T6) being interconnected, so that the third diode (D3) acts for all the second switching elements (T2 to T6).

5. The circuit arrangement as claimed in claim 4, characterized in that it has m first diodes (D1 to D61), where 1≦m≦n, the association in each case between a first diode (D1 to D61) and the n second switching elements (T2) being as desired.

6. The circuit arrangement as claimed in claim 1, characterized in that at least one second switching element (T2 to T6) has an operating electrode (CT2) which is coupled to the line between the storage capacitor (C1) and the control electrode of the first switching element (T1).

7. The circuit arrangement as claimed in claim 1, characterized in that a control electrode (BT2) of at least one second switching element (T2 to T6) is coupled to the line between the storage capacitor (C1) and the control electrode of the first switching element (T1).

8. The circuit arrangement as claimed in claim 1, characterized in that the storage capacitor (C1) is arranged in series with at least one resistor between a voltage source and the reference potential.

9. An operating device for a lamp having a circuit arrangement as claimed in claim 1, the circuit arrangement comprising a half-bridge arrangement with two half-bridge transistors (T1, T8), and the first switching element being one of the two half-bridge transistors (T1; T8).

* * * * *